United States Patent
Keser et al.

(10) Patent No.: US 10,665,522 B2
(45) Date of Patent: May 26, 2020

(54) PACKAGE INCLUDING AN INTEGRATED ROUTING LAYER AND A MOLDED ROUTING LAYER

(71) Applicant: Intel IP Corporation, Santa Clara, CA (US)

(72) Inventors: Lizabeth Keser, Munich (DE); Thomas Ort, Veitsbronn (DE); Thomas Wagner, Regelsbach (DE); Bernd Waidhas, Pettendorf (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/853,173

(22) Filed: Dec. 22, 2017

(65) Prior Publication Data
US 2019/0198478 A1     Jun. 27, 2019

(51) Int. Cl.
| | |
|---|---|
| *H01L 23/31* | (2006.01) |
| *H01L 21/48* | (2006.01) |
| *H01L 21/56* | (2006.01) |
| *H01L 21/78* | (2006.01) |
| *H01L 21/66* | (2006.01) |
| *H01L 23/538* | (2006.01) |
| *H01L 23/00* | (2006.01) |

(52) U.S. Cl.
CPC ...... *H01L 23/3192* (2013.01); *H01L 21/4853* (2013.01); *H01L 21/4857* (2013.01); *H01L 21/561* (2013.01); *H01L 21/565* (2013.01); *H01L 21/568* (2013.01); *H01L 21/78* (2013.01); *H01L 22/14* (2013.01); *H01L 23/3114* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 24/96* (2013.01); *H01L 23/3128* (2013.01); *H01L 2224/18* (2013.01); *H01L 2224/214* (2013.01); *H01L 2224/95001* (2013.01)

(58) Field of Classification Search
CPC ............ H01L 23/3157; H01L 23/3171; H01L 23/3185; H01L 23/3192; H01L 23/48–4825; H01L 23/485–4928; H01L 23/498–49861; H01L 2924/18162; H01L 23/3114; H01L 23/3135
See application file for complete search history.

(56) References Cited

U.S. PATENT DOCUMENTS

| | | | | |
|---|---|---|---|---|
| 6,639,324 B1 * | 10/2003 | Chien | ................. | H01L 23/3121 257/700 |
| 8,541,877 B2 * | 9/2013 | Tsai | ........................ | H01L 23/13 257/738 |
| 8,569,894 B2 * | 10/2013 | Su | ........................ | H01L 21/4857 257/698 |
| 9,006,882 B2 * | 4/2015 | Pagaila | ................. | H01L 21/568 257/723 |
| 9,818,708 B2 * | 11/2017 | Lee | ..................... | H01L 23/3135 |
| 9,859,245 B1 * | 1/2018 | Chen | ...................... | H01L 24/16 |

(Continued)

*Primary Examiner* — Scott B Geyer
(74) *Attorney, Agent, or Firm* — Schwegman Lundberg & Woessner, P.A.

(57) ABSTRACT

A semiconductor device and method is disclosed. Devices shown include a die coupled to an integrated routing layer, wherein the integrated routing layer includes a first width that is wider than the die. Devices shown further included a molded routing layer coupled to the integrated routing layer.

13 Claims, 5 Drawing Sheets

(56) References Cited

U.S. PATENT DOCUMENTS

| | | | |
|---|---|---|---|
| 2003/0134455 A1* | 7/2003 | Cheng | H01L 23/13 438/125 |
| 2010/0072570 A1* | 3/2010 | Pagaila | H01L 21/6835 257/528 |
| 2012/0112336 A1* | 5/2012 | Guzek | H01L 23/3114 257/698 |
| 2013/0122657 A1* | 5/2013 | Shimizu | H01L 23/3185 438/124 |
| 2014/0015125 A1* | 1/2014 | Lee | H01L 21/568 257/737 |
| 2014/0131886 A1* | 5/2014 | Paek | H01L 24/11 257/774 |
| 2015/0132892 A1* | 5/2015 | Hung | H01L 24/94 438/113 |
| 2015/0255412 A1* | 9/2015 | Meyer | G06F 1/1613 361/679.55 |
| 2015/0262844 A1* | 9/2015 | Meyer | H01L 23/3107 257/737 |
| 2016/0086902 A1* | 3/2016 | Lu | H01L 24/14 257/737 |
| 2017/0200686 A1* | 7/2017 | Kang | H01L 24/05 |
| 2018/0108638 A1* | 4/2018 | Lin | H01L 25/105 |
| 2018/0122764 A1* | 5/2018 | Chen | H01L 24/16 |
| 2018/0166396 A1* | 6/2018 | Lee | H01L 23/562 |

\* cited by examiner

PACKAGE INCLUDING AN INTEGRATED ROUTING LAYER AND A MOLDED ROUTING LAYER

TECHNICAL FIELD

Embodiments described herein generally relate to packaging configurations and methods for semiconductor devices.

BACKGROUND

In the semiconductor device industry, smaller and thinner devices are always desired. As sizes shrink, it can be challenging to provide high yield processes at low cost. For example, fan-out wafer level packaging (FOWLP) can suffer from yield loss due to die drift, mold cure shrinkage, and warpage. This may be exaggerated when multiple layers of redistribution metal are required to route the signal, power and ground from the semiconductor device to the final ball grid array pin or ball grid array solder ball. It is desirable to address these, and other challenges to small form factor semiconductor devices.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1A:
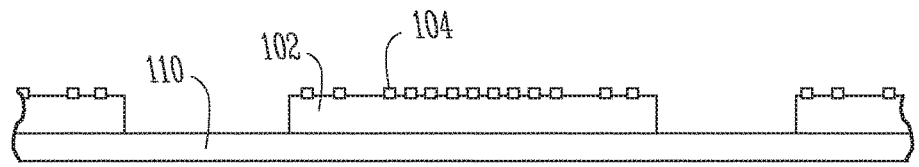
FIG. 1A-1F show selected stages of manufacture of a semiconductor device in accordance with some example embodiments.

FIGS. 1A-1F show steps of a process or forming a semiconductor device according to one example. A die 102 is shown mounted to a carrier 110. In one example, the die 102 is mounted on a fan out wafer level carrier 110. One advantage of manufacturing using a fan out wafer level process includes the ability to cheaply and easily form a number of small scale connections on a die, and to increase an amount of lateral area with which to form subsequent routing layers. In FIG. 1A, the dies 102 are spaced apart on the carrier 110, allowing more real estate on sides of the die to form fanned out interconnects. By processing multiple dies on a wafer level carrier 110 at the same time, efficiencies in processing operations can be gained.

In the example shown, the die 102 includes a plurality of pillars 104 extending from a surface of the die 102. In one example, the pillars include copper pillars or copper alloy pillars. Although copper and copper alloys are used as an example, the invention is not so limited. Other conductors such as aluminum, or other metals may be used.

In one example, the pillars 104 are formed using electroplating. In one example the pillars 104 are formed by physical deposition, such as sputtering. In one example, the pillars 104 are formed by chemical deposition in an electrolytic plating process. In one example, the pillars 104 are formed at a fine pitch to match with a scale of semiconductor devices formed on a surface, or within an active surface of the die 102. Further discussion of pitch differences used in examples of the invention are included below, and specifically in FIG. 3.

Figure 1B:
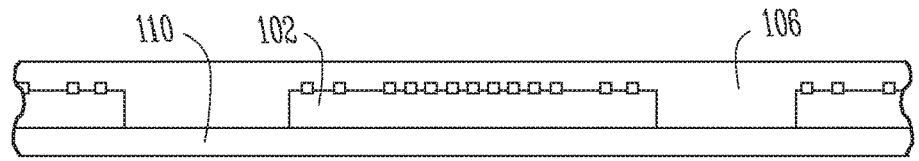

FIG. 1B shows a further processing operation. In FIG. 1B, an encapsulant 106 is formed over the die 102 and the pillars 104. In one example, the encapsulant may include an epoxy based encapsulant. Other polymeric based encapsulants may be used within the scope of the invention. In one example the encapsulant 106 may include one or more filler particles suspended in a polymeric matrix. In one example, the encapsulant 106 is molded or pressed over the die 102 and the pillars 104. A molding operation may facilitate filling of detailed and complex surface topography such as pillars 104.

An encapsulant 106 formed by a molding operation will be different physically than a dielectric material that is laminated and etched, or otherwise processed. For example, an encapsulant 106 formed by a molding operation will exhibit flow lines and final features that indicate the encapsulant 106 was formed using a molding operation.

Figure 1C:
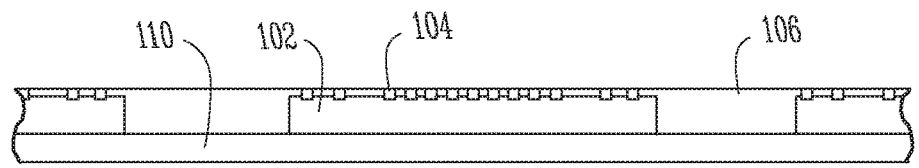

FIG. 1C shows a further processing operation. In FIG. 1C, the encapsulant 106 has been thinned to reveal a top surface of the pillars 104. In one example, the encapsulant 106 is ground using a slurry or other abrasive to provide the thinning. In one example, a grinding of the encapsulant 106 will be detectable upon inspection of a final product produced.

Figure 1D:
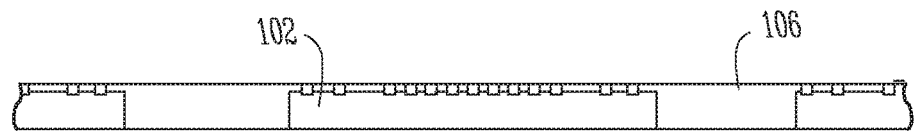

FIG. 1D shows a further processing operation. In FIG. 1D, the carrier 110 has been removed. However, the wafer (including multiple dies 102) remains as a single piece. Although the carrier 110 is removed at this stage in this example, the carrier 110 may also be removed at other points in the process. For example, the carrier 110 may be removed after step 1E described below.

Figure 1E:
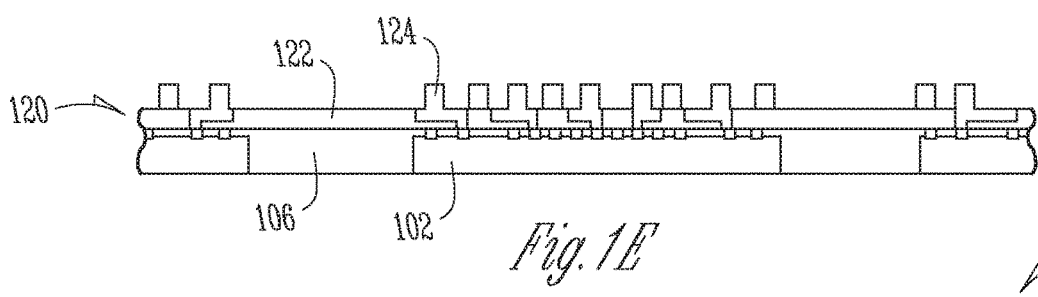

In FIG. 1E shows a further processing operation. In FIG. 1E, an integrated routing layer 120 is formed over the die 102, and coupled to the pillars 104. In one example, integral forming includes plating or otherwise forming conductor routes 124 (such as traces and vias) directly onto the pillars 104. Integral forming is described in contrast to subsequent connection of a separate circuit board, by a connecting structure such as a solder ball.

FIG. 1E shows a number of conductor routes 124 embedded, or partially embedded within a dielectric 122. In one example, the dielectric 122 is deposited one layer at a time over individual layers of conductor routes 124. Depositing the dielectric 122 from a material such as a polyimide based material provides a number of manufacturing advantages, similar to those described above. Deposition, for example spin coating, is capable of easily filling a complex topography, such as deposited layers of conductor routes 124. As discussed above, manufacturing efficiencies are gained by forming the integrated routing layer 120 on a wafer level, using fan out wafer level processing techniques. Although wafer level is used as an example, other batch processing may be used within the scope of the invention. In one example, a panel level batch process is used instead of a wafer batch process.

Figure 1F:
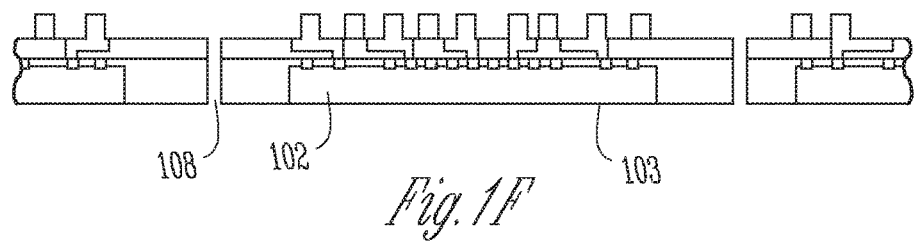

In FIG. 1F, the wafer has been singulated along lines 108 to provide a number of individual batch processed semiconductor devices 130. In this context, the term "wafer level semiconductor devices" refers to individual devices that were formed at a wafer level, as described in examples above, and later singulated as shown in FIG. 1F. As discussed above, the method of manufacture of the individual batch processed semiconductor devices 130 can be detected in a number of ways, including, but not limited to, detected flow of encapsulant, and integrated build up of the integrated routing layer 120.

FIG. 1F also shows an exposed back surface 103 of the die 102 that results from the manufacturing process described in FIGS. 1A-1F. One advantage of an exposed back surface 103 includes improved cooling of the die 102 during operation. The example of FIGS. 1A-1F lead to an exposed back surface 103 because of the location of the die 102 adjacent to the carrier 102 in FIGS. 1A-1C. Other examples of exposure of a die back surface are described in examples below.

FIGS. 2A-2F show steps of another process or forming a semiconductor device according to one example. Similar to FIGS. 1A-1F, a die 202 is shown mounted to a carrier 210. In one example, the die 202 is mounted on a fan out wafer level carrier 210. Although a fan out wafer level carrier 210 is sued as an example, other batch process carriers, such as a panel carrier (rectangular, not circular like a wafer) may be used.

In the example shown, the die 202 includes a plurality of contacts 204 formed within, and coplanar with a surface of the die 202. In one example, the contacts 204 are formed using electroplating. In one example the contacts 204 are formed by physical deposition, such as sputtering. In one example, the contacts 204 are formed by chemical deposition in an electroless process. In one example, the contacts 204 are formed at a fine pitch to match with a scale of semiconductor devices formed on a surface, or within an active surface of the die 202.

Figure 2A:
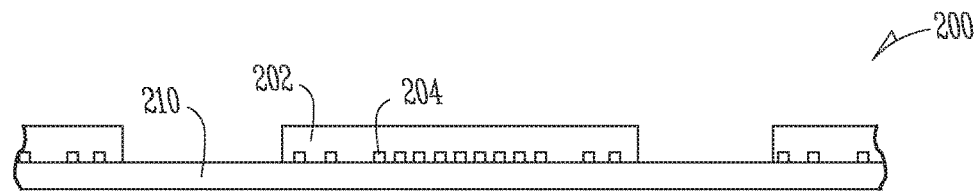
FIG. 2A-2F show selected stages of manufacture of another semiconductor device in accordance with some example embodiments.
Figure 2B:
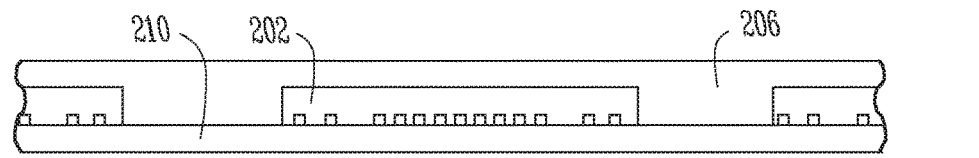

FIG. 2B shows a further processing operation. In FIG. 2B, an encapsulant 206 is formed over the die 202. In one example, the encapsulant 206 may include an epoxy based encapsulant. Other polymeric based encapsulants may be used within the scope of the invention. In one example the encapsulant 206 may include one or more filler particles suspended in a polymeric matrix. In one example, the encapsulant 206 is molded or pressed over the die 202.

As discussed in examples above, an encapsulant 206 formed by a molding operation will be different physically than a dielectric material that is laminated and etched, or otherwise processed. For example, an encapsulant 206 formed by a molding operation will exhibit flow lines and final features that indicate the encapsulant 206 was formed using a molding operation.

Figure 2C:
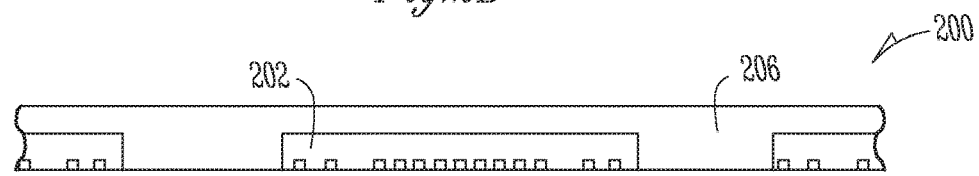

FIG. 2C shows a further processing operation. In FIG. 2C, the carrier 210 has been removed, and the contacts 204 are exposed. In contrast to the example of FIGS. 1A-1F, the configuration of FIG. 2C does not require any thinning operation such as grinding to expose the contacts 204. Only removal of the carrier 210 is required. Similar to FIG. 1D, although the carrier 210 has been removed, the wafer (including multiple dies 202) remains as a single piece.

Figure 2D:
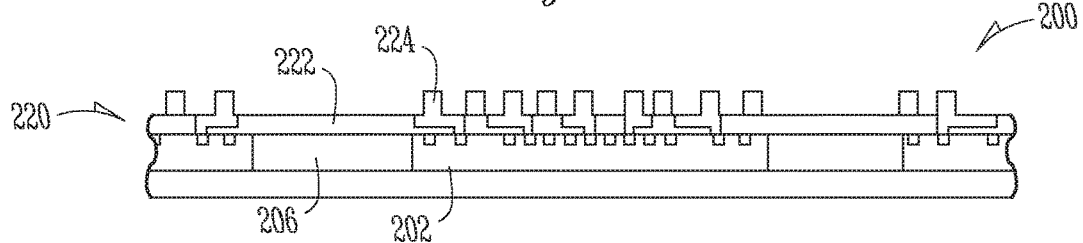

In FIG. 2D shows a further processing operation. In FIG. 2D, an integrated routing layer 220 is formed over the die 202, and coupled to the contacts 204. In one example, integral forming includes plating or otherwise forming conductor routes 224 (such as traces and vias) directly onto the contacts 204. Integral forming is described in contrast to subsequent connection of a separate circuit board, by a connecting structure such as a solder ball.

FIG. 2D shows a number of conductor routes 224 embedded, or partially embedded within a dielectric 222. In one example, the dielectric 222 is deposited one layer at a time over individual layers of conductor routes 224. Depositing the dielectric 222 from a material such as a polyimide based material provides a number of manufacturing advantages. Deposition, such as spin coating, is capable of easily filling a complex topography, such as deposited layers of conductor routes 224. As discussed above, manufacturing efficiencies are gained by forming the integrated routing layer 220 on a wafer level, using fan out wafer level processing techniques. Other batch processing, such as panel level are also within the scope of the invention.

Figure 2E:
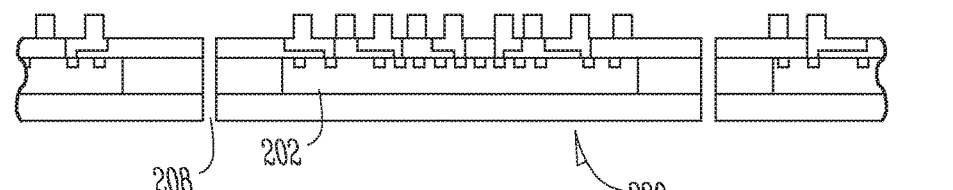

In FIG. 2E, the wafer has been singulated along lines 208 to provide a number of individual batch processed semiconductor devices 230. In this context, the term "wafer level semiconductor devices" refers to individual devices that were formed at a wafer level, as described in examples above, and later singulated as shown in FIG. 2E. As discussed above, the method of manufacture of the individual batch processed semiconductor devices 230 can be detected in a number of ways, including, but not limited to, detected flow of encapsulant, and integrated build up of the integrated routing layer 220.

Figure 2F:
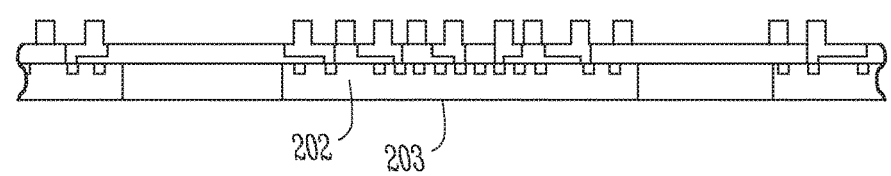

FIG. 2F shows a further processing operation. In FIG. 2F, the individual batch processed semiconductor devices 230 have been thinned, for example by grinding, to show an exposed back surface 203 of the die 202. One advantage of an exposed back surface 203 includes improved cooling of the die 102 during operation. In one example, a thinning operation is detectable using features such as grind marks. In one example the die 202 and the encapsulant 206 are ground concurrently, and may exhibit continuous grinding marks across both surfaces.

In one example, after grinding, an exposed ground die surface 203 may be subsequently etched to remove grind marks. The presence of grind marks may leave unwanted stress concentration features and/or residual stresses in the die surface that may lead to die cracking. After an etching operation, the absence of grind marks may indicate that the etch operation has been performed.

Figure 3:
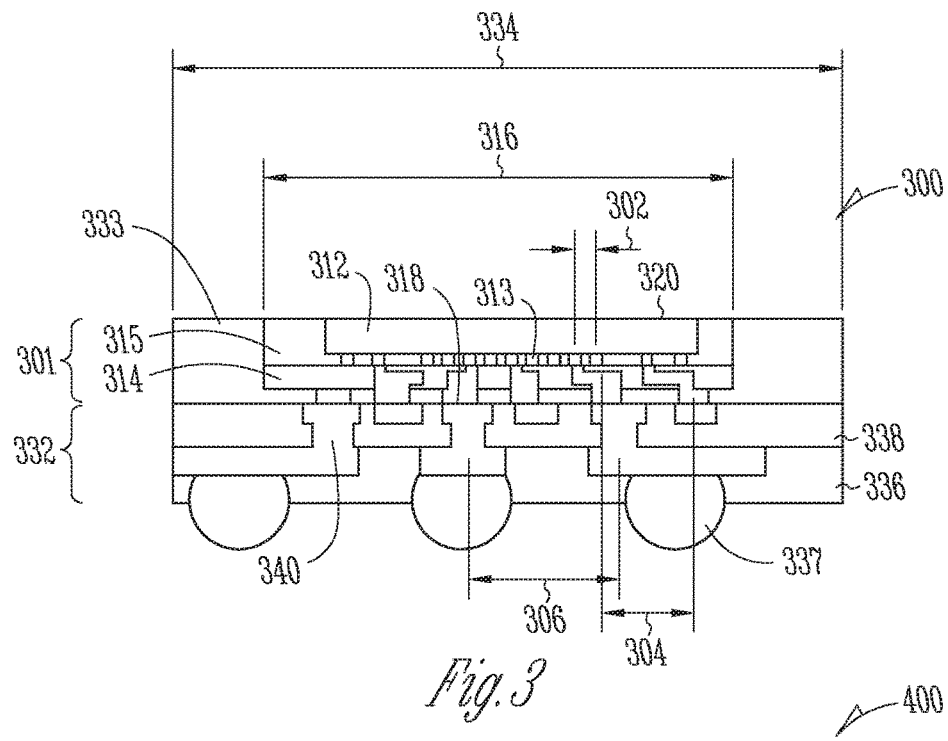
FIG. 3 shows a semiconductor device in accordance with some example embodiments.

FIG. 3 shows a semiconductor device 300 according to selected examples. In FIG. 3, an individual batch processed semiconductor device 301 is shown coupled to a molded routing layer 332. In one example the individual batch processed semiconductor device 301 is formed using example processes as described in FIGS. 1A-1F.

A die 312 is shown having a plurality of pillars 313 extending from a surface of the die 312. An integrated routing layer 314 is shown coupled to the die 312. A first encapsulant 315 is shown laterally surrounding the die 312, and extending laterally to the same width 316 as the integrated routing layer 314. The plurality of pillars 313 are shown formed to a die interconnect pitch 302.

In one example, the molded routing layer 332 is formed separate from the individual batch processed semiconductor device 301 and later attached to the individual batch processed semiconductor device 301. In one example, a connection at interface 318 includes a solder connection between the conductor routes of the integrated routing layer 314 and conductor routes 340 of the molded routing layer 332. In one example, after attachment of the individual batch processed semiconductor device 301 to the molded routing layer 332, a second encapsulant 333 is molded over the individual batch processed semiconductor device 301. As shown in FIG. 3, in one example, the second encapsulant 333 extends laterally to the same width 334 as the molded routing layer 332. In the example of FIG. 3, the second encapsulant 333 forms an interface with the first encapsulant 315 that will be detectable in the final semiconductor device 300.

Although the molded routing layer 332 is shown as wider than the integrated routing layer 314, the invention is not so limited. In selected examples, the molded routing layer 332 is the same width as the integrated routing layer 314.

In one example, the molded routing layer 332 is formed in layers by plating or otherwise adding conductor routes 340 in layers, then subsequently molding an encapsulant 338 over each successive layer of conductor routes 340. Although the molded routing layer 332 will be an integral component when complete, interfaces between individually formed layers will be detectable in the final product. Molding the encapsulant 338 from a material such as an epoxy based material provides a number of manufacturing advantages. A molding process is capable of easily filling a complex topography, such as deposited layers of conductor routes 340. In one example, a layer of solder resist 336 is further used to pattern and apply solder balls 337 on the conductor routes 340.

In the example shown the plurality of pillars 313 are shown formed to a die interconnect pitch 302. The integrated routing layer 314 is formed to a first interconnect pitch 304. The molded muting layer 332 is formed to a second interconnect pitch 306. In the example shown, the first interconnect pitch 304 is larger than a die interconnect pitch 302, and the second interconnect pitch 306 is larger than the first interconnect pitch 304.

One advantage of the method of manufacture described in FIG. 3, includes the ability to test sub-assemblies such as the individual dies 312, and the individual batch processed semiconductor devices 301, before final formation of the semiconductor device 300. This process improves yield of the resulting semiconductor devices 300 by only using good sub-assemblies at each step of manufacture. Additionally, by breaking up the routing into an integrated routing layer 314 and a molded routing layer 332, the individual processes become more reliable. The need to only form smaller numbers of routing layers in each of the integrated routing layer 314 and the molded routing layer 332 make the processes less complicated, and lead to better yield. Breaking up the routing into the integrated muting layer 314 and the molded routing layer 332 further allows the differences in interconnect pitch 304, 306 described above. All of these advantages are accomplished without the need to make the semiconductor device 300 thicker, which is desirable for small devices such as mobile telephones, tablets, etc.

In FIG. 3, as a result of the method of forming the individual batch processed semiconductor devices 301, a backside 320 of the die 312 is exposed.

Figure 4:
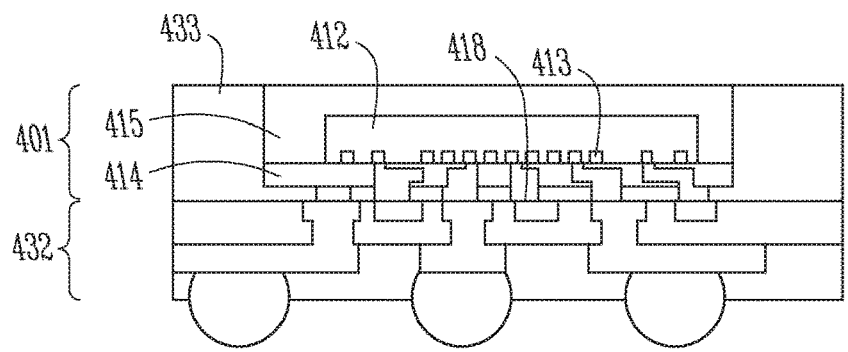
FIG. 4 shows a semiconductor device in accordance with some example embodiments.

FIG. 4 shows a semiconductor device 400 according to selected examples. In FIG. 4, an individual batch processed semiconductor device 401 is shown coupled to a molded routing layer 432. In one example the individual batch processed semiconductor device 301 is formed using example processes as described in FIGS. 2A-2F.

A die 412 is shown having a plurality of contacts 413 formed flush with a surface of the die 412. An integrated routing layer 414 is shown coupled to the die 412. A first encapsulant 415 is shown laterally surrounding the die 412, and extending laterally to the same width as the integrated routing layer 414.

In one example, the molded routing layer 432 is formed separate from the individual batch processed semiconductor device 401 and later attached to the individual batch processed semiconductor device 401. In one example, a connection at interface 418 includes a solder connection between the conductor routes of the integrated routing layer 414 and conductor routes of the molded routing layer 432. In one example, after attachment of the individual batch processed semiconductor device 401 to the molded routing layer 432, a second encapsulant 433 is molded over the individual batch processed semiconductor device 401. As shown in FIG. 4, in one example, the second encapsulant 433 extends laterally to the same width as the molded routing layer 432. In the example of FIG. 4, the second encapsulant 433 forms an interface with the first encapsulant 415 that will be detectable in the final semiconductor device 400.

Figure 5:
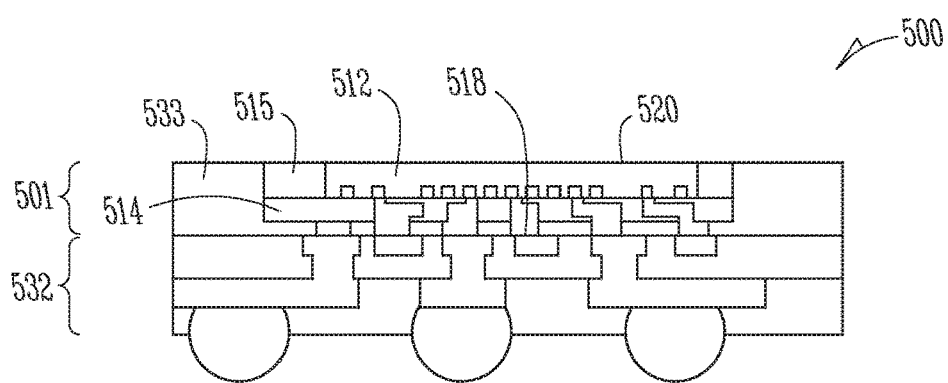
FIG. 5 shows a semiconductor device in accordance with some example embodiments.

FIG. 5 shows a semiconductor device 500 according to selected examples. In FIG. 5, an individual batch processed semiconductor device 501 is shown coupled to a molded routing layer 532. In one example the individual batch processed semiconductor device 501 is formed using example processes as described in FIGS. 2A-2F.

A die 512 is shown. An integrated routing layer 514 is shown coupled to the die 512. A first encapsulant 515 is shown laterally surrounding the die 512, and extending laterally to the same width as the integrated routing layer 514.

In one example, the molded routing layer 532 is formed separate from the individual batch processed semiconductor device 501 and later attached to the individual batch processed semiconductor device 501. In one example, a connection at interface 518 includes a solder connection between the conductor routes of the integrated routing layer 514 and conductor routes of the molded routing layer 532. In one example, after attachment of the individual batch processed semiconductor device 501 to the molded routing layer 532, a second encapsulant 533 is molded over the individual batch processed semiconductor device 501. As shown in FIG. 5, in one example, the second encapsulant 533 extends laterally to the same width as the molded routing layer 532. In the example of FIG. 5, the second encapsulant 533 forms an interface with the first encapsulant 515 that will be detectable in the final semiconductor device 500.

In FIG. 5, the individual batch processed semiconductor device 501 has been thinned, for example by grinding, to show an exposed back surface 520 of the die 512. One advantage of an exposed back surface 520 includes improved cooling of the die 512 during operation. Another advantage includes a smaller form factor for use in thinner devices. In one example, a thinning operation is detectable using features such as grind marks. In one example the die 512 and the encapsulants 515, 533 are ground concurrently, and may exhibit continuous grinding marks across all surfaces.

In one example, after grinding, an exposed ground die surface 520 may be subsequently etched to remove grind marks. The presence of grind marks may leave unwanted stress concentration features and/or residual stresses in the die surface that may lead to die cracking. After an etching operation, the absence of grind marks may indicate that the etch operation has been performed.

Figure 6:
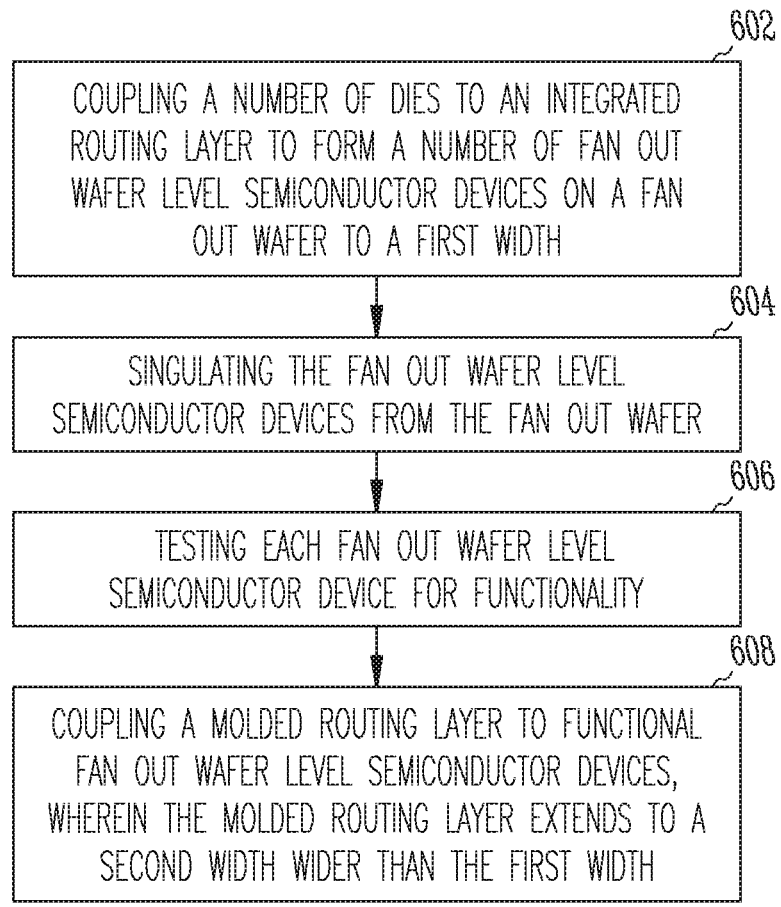
FIG. 6 shows a flow diagram of a method of manufacture of a semiconductor device in accordance with some example embodiments.

FIG. 6 shows a flow diagram of a method of manufacture according to one example. In operation 602, a number of dies are coupled to an integrated routing layer to form a number of fan out wafer level semiconductor devices on a fan out wafer to a first width. In operation 604, the fan out wafer level semiconductor devices are singulated from the fan out wafer. In operation 606, each fan out wafer level semiconductor devices are tested for functionality. In operation 608, a molded routing layer is coupled to functional fan out wafer level semiconductor devices, wherein the molded routing layer extends to a second width wider than the first width.

Figure 7:
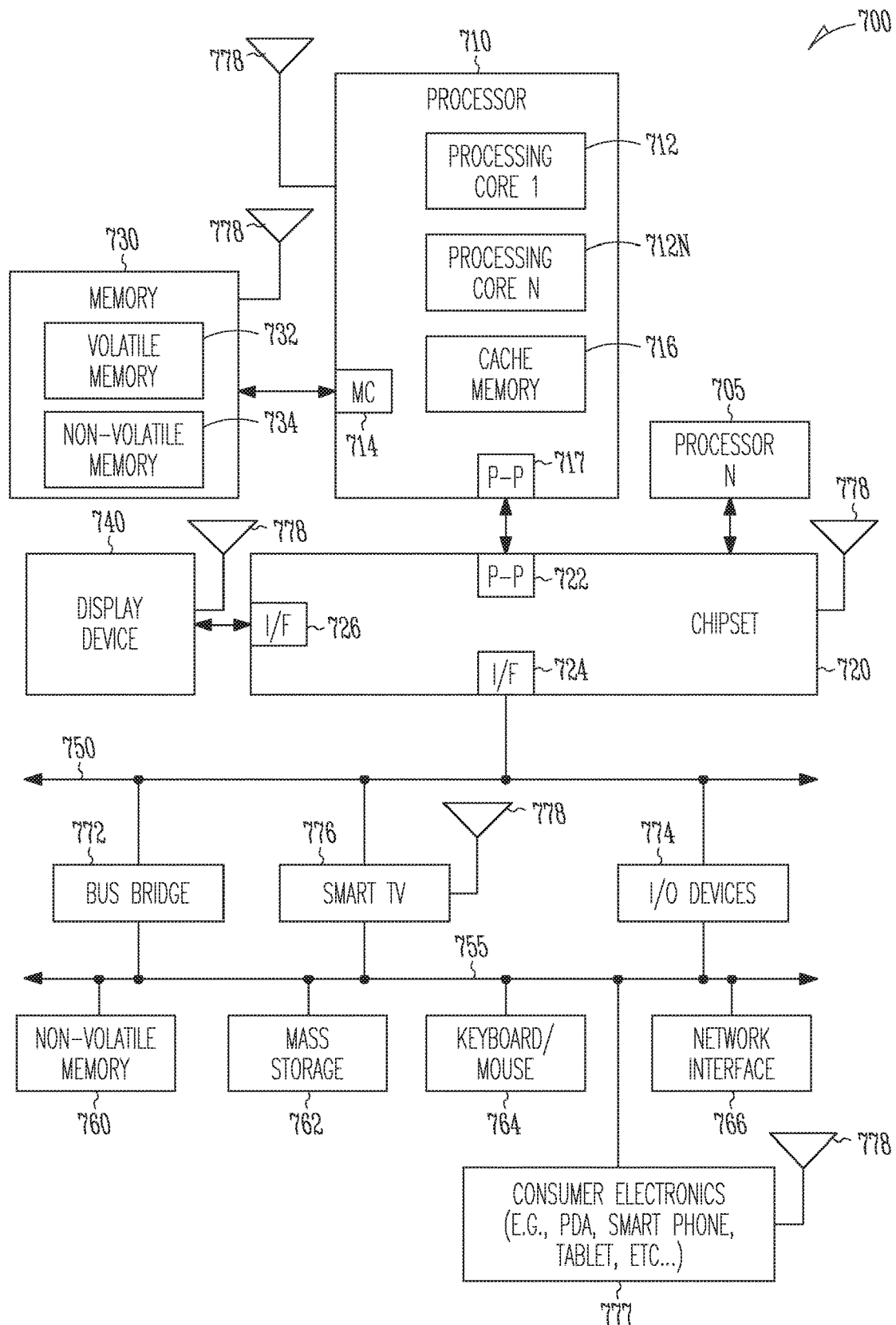
FIG. 7 shows a system that may incorporate semiconductor devices and methods, in accordance with some example embodiments.

FIG. 7 illustrates a system level diagram, depicting an example of an electronic device (e.g., system) that may include semiconductor devices routing layers, encapsulants, etc. described above. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system.

In one embodiment, processor 710 has one or more processor cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, an interface for wireless antenna 778 operates in accordance with, but is not limited to, the IEEE 802.11 standard and its related family. Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the example system, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices, including a bus bridge 772, a smart TV 776. I/O devices 774, nonvolatile memory 760, a storage medium (such as one or more mass storage devices) 762, a keyboard/mouse 764, a network interface 766, and various forms of consumer electronics 777 (such as a PDA, smart phone, tablet etc.), etc. In one embodiment, chipset 720 couples with these devices through an interface 724. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a light emitting diode (LED) array, an organic light emitting diode (OLED) array, or any other form of visual display device. In some embodiments of the example system, processor 710 and chipset 720 are merged into a single SOC. In addition, chipset 720 connects to one or more buses 750 and 755 that interconnect various system elements, such as I/O devices 774, nonvolatile memory 760, storage medium 762, a keyboard/mouse 764, and network interface 766. Buses 750 and 755 may be interconnected together via a bus bridge 772.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

To better illustrate the method and apparatuses disclosed herein, a non-limiting list of embodiments is provided here:

Example 1 includes a semiconductor device. The semiconductor device includes a die coupled to an integrated routing layer, wherein the integrated routing layer includes a first width that is wider than the die, and a molded routing layer coupled to the integrated routing layer, wherein the molded routing layer includes a second width that is wider than the first width.

Example 2 includes the semiconductor device of example 1, wherein the die is coupled to the integrated routing layer through a plurality of pillars extending from a surface of the die.

Example 3 includes the semiconductor device of any one of examples 1-2, wherein the die is coupled to the integrated routing layer through a plurality of contacts that are flush with a surface of the die.

Example 4 includes the semiconductor device of any one of examples 1-3, wherein the molded routing layer is coupled to the integrated routing layer through one or more solder connections.

Example 5 includes the semiconductor device of any one of examples 1-4, wherein the die is laterally surrounded by a first encapsulant that extends laterally to the same width as the integrated routing layer.

Example 6 includes the semiconductor device of any one of examples 1-5, wherein the first encapsulant is laterally surrounded by a second encapsulant that extends laterally to the same width as the molded routing layer.

Example 7 includes the semiconductor device of any one of examples 1-6, wherein the integrated muting layer includes a first interconnect pitch that is larger than a die interconnect pitch, and wherein the molded routing layer includes a second interconnect pitch that is larger than the first interconnect pitch.

Example 8 includes the semiconductor device of any one of examples 1-7, wherein a backside of the die is exposed.

Example 9 includes the semiconductor device of any one of examples 1-2, wherein a backside of the die is thinned from a first thickness to a second thickness along with portions of the first encapsulant and second encapsulant.

Example 10 includes an electronic system. The Electronic system includes a processor die coupled to an integrated routing layer, wherein the integrated routing layer includes a first width that is wider than the die, a molded routing layer coupled to the integrated routing layer, wherein the molded routing layer includes a second width that is wider than the first width, a circuit board coupled to the molded routing layer, and a memory device coupled to the circuit board, wherein the circuit board is configured to route communications between the processor die and the memory device.

Example 11 includes the electronic system of example 10, further including a touch screen interface coupled to the circuit board.

Example 12 includes the electronic system of any one of examples 10-11, further including wireless antenna coupled to the circuit board.

Example 13 includes the electronic system of any one of examples 10-12, wherein the die is laterally surrounded by a first encapsulant that extends laterally to the same width as the integrated routing layer.

Example 14 includes the electronic system of any one of examples 10-13, wherein the first encapsulant is laterally surrounded by a second encapsulant that extends laterally to the same width as the second molded routing layer.

Example 15 includes the electronic system of any one of examples 10-14, wherein a backside of the die is exposed.

Example 16 includes the electronic system of any one of examples 10-15, wherein a backside of the die is thinned from a first thickness to a second thickness along with portions of the first encapsulant and second encapsulant.

Example 17 includes a method, comprising coupling a number of dies to an integrated routing layer to form a number of fan out wafer level semiconductor devices on a fan out wafer to a first width, singulating the fan out wafer level semiconductor devices from the fan out wafer, testing each fan out wafer level semiconductor device for functionality, and coupling a molded routing layer to functional fan out wafer level semiconductor devices, wherein the molded routing layer extends to a second width wider than the first width.

Example 18 includes the method of example 17, wherein coupling the molded routing layer to functional fan out wafer level semiconductor devices includes soldering the molded routing layer to functional fan out wafer level semiconductor devices.

Example 19 includes the method of any one of examples 17-18, further including encapsulating the functional fan out wafer level semiconductor devices to a width that extends laterally to the same width as the molded routing layer.

Example 20 includes the method of any one of examples 17-19, further including exposing a backside of the die in the functional fan out wafer level semiconductor devices.

Example 21 includes the method of any one of examples 17-20, further including grinding a backside of the die in the functional fan out wafer level semiconductor devices.

Example 22 includes the method of any one of examples 17-21, further including etching a ground surface of the die in the functional fan out wafer level semiconductor devices.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. A semiconductor device, comprising:
a die coupled to an integrated routing layer, wherein the integrated routing layer includes a first width that is wider than the die and a first pitch;
a molded routing layer coupled to the integrated routing layer, wherein the molded routing layer includes a second width that is wider than the first width and a second pitch greater than the first pitch;
wherein the die is laterally surrounded by a first encapsulant that extends laterally to the same width as the integrated routing layer; and
wherein the first encapsulant is laterally surrounded by a second encapsulant that extends laterally to the same width as the molded routing layer, wherein the integrated routing layer includes a first interconnect pitch that is larger than a die interconnect pitch, and wherein the molded routing layer includes a second interconnect pitch that is larger than the first interconnect pitch.

2. The semiconductor device of claim 1, wherein the die is coupled to the integrated routing layer through a plurality of pillars extending from a surface of the die.

3. The semiconductor device of claim 1, wherein the die is coupled to the integrated routing layer through a plurality of contacts that are flush with a surface of the die.

4. The semiconductor device of claim 1, wherein the molded routing layer is coupled to the integrated routing layer through one or more solder connections.

5. The semiconductor device of claim 1, wherein a backside of the die is exposed.

6. The semiconductor device of claim 1, wherein a backside of the die is thinned from a first thickness to a second thickness along with portions of the first encapsulant and second encapsulant.

7. A electronic system, comprising:
a processor die coupled to an integrated routing layer, wherein the integrated routing layer includes a first width that is wider than the die;
a molded routing layer coupled to the integrated routing layer, wherein the molded routing layer includes a second width that is wider than the first width;
a circuit board coupled to the molded routing layer; and
a memory device coupled to the circuit board, wherein the circuit board is configured to route communications between the processor die and the memory device.

8. The electronic system of claim 7, further including a touch screen interface coupled to the circuit board.

9. The electronic system of claim 7, further including wireless antenna coupled to the circuit board.

10. The electronic system of claim 7, wherein the die is laterally surrounded by a first encapsulant that extends laterally to the same width as the integrated routing layer.

11. The electronic system of claim 10, wherein the first encapsulant is laterally surrounded by a second encapsulant that extends laterally to the same width as the second molded routing layer.

12. The electronic system of claim 7, wherein a backside of the die is exposed.

13. The electronic system of claim 7, wherein a backside of the die is thinned from a first thickness to a second thickness along with portions of the first encapsulant and second encapsulant.

* * * * *